US 6,750,592 B2

(12) United States Patent
Takahashi et al.

(10) Patent No.: US 6,750,592 B2
(45) Date of Patent: Jun. 15, 2004

(54) SURFACE ACOUSTIC WAVE FILTER AND SURFACE ACOUSTIC WAVE FILTER APPARATUS

(75) Inventors: Yoshihiro Takahashi, Tokyo (JP); Tadaaki Tsuda, Tokyo (JP); Yasushi Yamamoto, Tokyo (JP); Hiroshi Kawahara, Tokyo (JP)

(73) Assignee: NRS Technologies, Inc., Hakodate (JP)

( * ) Notice: Subject to any disclaimer, the term of this patent is extended or adjusted under 35 U.S.C. 154(b) by 119 days.

(21) Appl. No.: 09/985,898

(22) Filed: Nov. 6, 2001

(65) Prior Publication Data

US 2002/0043891 A1 Apr. 18, 2002

(30) Foreign Application Priority Data

Nov. 9, 2000 (JP) .......................... 2000-342687

(51) Int. Cl.[7] .................. H01L 41/04; H01L 41/08; H01L 41/18; H02N 2/00
(52) U.S. Cl. ................ 310/313 D; 333/186; 333/193; 264/435; 264/436; 310/366
(58) Field of Search ............... 310/313 D, 366; 264/435, 436; 333/186, 187

(56) References Cited

U.S. PATENT DOCUMENTS

| 5,252,882 | A | * | 10/1993 | Yatsuda ................. 310/313 R |
| 5,837,332 | A | * | 11/1998 | Takahashi et al. ........... 427/600 |
| 5,838,091 | A | * | 11/1998 | Watanabe ............... 310/313 C |
| 5,986,524 | A | * | 11/1999 | Shimoe ....................... 333/195 |
| 6,072,377 | A | * | 6/2000 | Tajima et al. ................. 333/154 |
| 6,194,808 | B1 | * | 2/2001 | Yamanouchi et al. ... 310/313 R |
| 6,356,167 | B1 | * | 3/2002 | Kadota et al. ................ 333/193 |
| 6,369,674 | B1 | * | 4/2002 | Matsumoto et al. ......... 333/195 |
| 6,373,167 | B1 | * | 4/2002 | Yoshimoto et al. ....... 310/313 D |
| 6,404,101 | B1 | * | 6/2002 | Taniguchi et al. ........ 310/313 A |
| 6,426,583 | B1 | * | 7/2002 | Onishi et al. ............. 310/313 R |
| 6,437,668 | B1 | * | 8/2002 | Nakao et al. ................ 333/193 |

FOREIGN PATENT DOCUMENTS

| JP | 60-124109 | | 7/1985 | |
| JP | 60124109 | A * | 7/1985 | ............ H03H/9/25 |
| JP | 02078314 | A * | 3/1990 | ............ H03H/9/25 |
| JP | 02177609 | A * | 7/1990 | ............ H03H/9/25 |
| JP | 03284006 | A * | 12/1991 | ............ H03H/9/25 |
| JP | 7-46077 | | 2/1995 | |
| JP | 07046077 | A * | 2/1995 | ......... H03H/9/145 |
| JP | 9-172349 | | 6/1997 | |
| JP | 09172349 | A * | 6/1997 | ............ H03H/9/25 |
| JP | 09186550 | A * | 7/1997 | ............ H03H/9/25 |
| JP | 11-88107 | | 3/1999 | |
| JP | 11088107 | A * | 3/1999 | ............ H03H/9/25 |

OTHER PUBLICATIONS

Takahashi, et al., Saw Filter Device and Package for Accommodating the Same, U.S. patent application Publication, May 9, 2002 2002/0053958A1.*

* cited by examiner

Primary Examiner—Nicholas Ponomarenko
Assistant Examiner—J. Aguirrechea
(74) Attorney, Agent, or Firm—McGinn & Gibb, PLLC

(57) ABSTRACT

The present invention relates to a surface acoustic wave filter in which a plurality of pairs of comb electrode patterns are formed on an upper surface of a chip substrate made of a piezoelectric material. The surface acoustic wave filter includes a high-resistance pattern formed to surround a peripheral portion of the chip substrate on an upper surface side thereof, and a plurality of patterns formed to connect the high-resistance pattern to the respective comb electrode patterns.

19 Claims, 6 Drawing Sheets

SURFACE ACOUSTIC WAVE FILTER AND SURFACE ACOUSTIC WAVE FILTER APPARATUS

BACKGROUND OF THE INVENTION

1. Field of the Invention

The present invention relates to a surface acoustic wave filter and surface acoustic wave filter apparatus used in an optical communication device and mobile radio communication device.

2. Description of the Prior Art

A surface acoustic wave filter (to be referred to as SAW (Surface Acoustic Wave) filter hereinafter) has features such as compactness, high stability, high precision, high reliability, and no need for adjustment, and is widely used as a functional element for controlling an RF signal in an optical communication device and mobile communication device. For example, the SAW filter is used as a functional element such as a frequency selection element, filter element, resonator, and delay element.

The SAW filter controls an electrical RF signal through a surface acoustic wave propagating on the surface of the base material. As the base material, a piezoelectric material such as rock crystal, LBO, lithium tantalate ($LiTaO_3$), or lithium niobate ($LiNbO_3$) is generally used. In the following description, a base material made of a piezoelectric material is called a chip substrate. A plurality of come electrode patterns (Interdigital Transducers: IDTs) are formed on the chip substrate by using, e.g., the thin film formation technique and photolithography technique.

In the SAW filter, a pair of comb electrode patterns, or several pairs of comb electrode patterns arranged in the propagating direction of the surface acoustic wave are formed. The SAW filter can select a frequency which depends on the line width of the comb electrode patterns by converting an electrical RF signal into a surface acoustic wave and vice versa on a surface wave propagation path serving as a range where the comb electrode patterns are formed.

The SAW filter is generally used as it is accommodated in a package. In the following description, a SAW filter accommodated in a package is called a SAW filter apparatus. The comb electrode patterns are connected, through bonding wires or the like, to an input signal electrode terminal, output signal electrode terminal, and ground terminals formed on a package which is to accommodate the SAW filter.

The piezoelectric material has pyroelectric properties. In mounting a SAW filter apparatus on a printed wiring board or the like, when soldering is performed by reflow, or when a thermal shock test is performed, causing a sharp temperature change in the surrounding environment, polarization may occur in the piezoelectric material to generate charges on the surface of the chip substrate. When charges are generated on the surface of the chip substrate, they produce an electric field on the comb electrode patterns. When the electric field of a portion where the charges are concentrated most reaches a dielectric breakdown level, discharge occurs between the comb electrode patterns. In the worst case, pattern destruction is caused by discharge.

In order to prevent discharge between the comb electrode patterns, a package made of a ceramic material is used as the package for accommodating the SAW filter, and a metal film is formed on the bottom surface of the interior of the package by plating or vapor deposition. More specifically, a ceramic package, in which a metal film comes into contact with the lower surface of the chip substrate of the SAW filter when the SAW filter is accommodated in it, is used. Then, the ground electrode of the SAW filter and the metal film are connected to each other. When this package is used, even if polarization occurs to generate charges, the generated charges are released to the metal film, and destruction of the comb electrode patterns is prevented.

A plastic package is sometimes used in order to reduce the manufacturing cost of the SAW filter. It is, however, difficult to form a metal film on the plastic package by plating or vapor deposition. In other words, it is difficult to provide a package with a means for releasing charges which are generated when polarization occurs. Accordingly, a SAW filter cannot but be packaged with no metal film being present between the plastic package and SAW filter. As a result, to be able to use a plastic package, it is important that the chip substrate itself of the SAW filter have a structure with which polarization does not occur or which releases charges generated when polarization occurs.

SUMMARY OF THE INVENTION

The present invention has been made in consideration of the above situation in the prior art, and has as its object to provide a SAW filter with a structure that can prevent the comb electrode patterns from being destroyed by charges generated when polarization occurs, and a SAW filter apparatus with a structure that can prevent the comb electrode patterns from being destroyed by charges even if no countermeasure is taken on the package side.

In order to achieve the above object, according to the first aspect of the present invention, there is provided a surface acoustic wave filter in which a plurality of pairs of comb electrode patterns are formed on an upper surface of a chip substrate made of a piezoelectric material, comprising a high-resistance pattern formed to surround a peripheral portion of the chip substrate on an upper surface side, and a plurality of patterns formed to connect the high-resistance pattern to the respective comb electrode patterns.

In order to achieve the above object, according to the second aspect of the present invention, there is provided a surface acoustic wave filter in which a plurality of pairs of comb electrode patterns are formed on an upper surface of a chip substrate made of a piezoelectric material, comprising a first pattern formed on the upper surface of the chip substrate so as to extend from part of at least one member of each of the pairs of comb electrode patterns, a second pattern formed on the upper surface of the chip substrate so as to oppose the first pattern at a predetermined gap, and a dummy electrode pattern formed on the upper surface of the chip substrate so as to be adjacent to the second pattern and connected thereto.

In order to achieve the above object, according to the third aspect of the present invention, there is provided a surface acoustic wave filter in which a plurality of pairs of comb electrode patterns are formed on an upper surface of a chip substrate made of a piezoelectric material, wherein opposing portions of two comb electrode patterns that form a pair are not sharp.

A surface acoustic wave filter apparatus according to the present invention is obtained by accommodating either one of the surface acoustic wave filters according to the first to third aspects in a plastic package.

Furthermore, a metal plate-like portion is formed at a center of the package that accommodates the surface acoustic wave filter, and a lower surface of the chip substrate which constitutes the surface acoustic wave filter is fixed to the package with a conductive adhesive.

As is apparent from the above aspects, according to the present invention, the SAW filter has the high-resistance pattern to surround the peripheral portion of the chip substrate on the upper surface side, and the patterns to connect the respective comb electrode patterns to the high-resistance pattern. The comb electrode patterns are set at the same potential, and accordingly discharge between the comb electrode patterns can be prevented, so destruction of the comb electrode patterns can be prevented.

When the first pattern formed by extending part of the comb electrode pattern, the second pattern formed to oppose the first pattern at the predetermined gap, and the dummy electrode pattern to be connected to the second pattern are formed on the upper surface of the chip substrate, even if polarization occurs in the chip substrate to generate charges, thus causing discharge, this discharge occurs in the gap, so discharge between the comb electrode patterns can be prevented.

Of the respective comb electrode patterns, when the opposing portions of two comb electrode patterns that form a pair are formed to be not sharp, even if polarization occurs in the chip substrate to generate charges, discharge does not occur easily between the comb electrode patterns.

If such a SAW filter is accommodated in a package and the resultant structure is used as a SAW filter apparatus, particularly when the SAW filter apparatus is mounted on a substrate or the SAW filter apparatus is tested, destruction of the comb electrode patterns, which is caused when charges are generated in the chip substrate due to polarization, can be prevented.

When the metal plate-like portion is formed on the package, if the lower surface of the chip substrate is fixed to the package with the conductive adhesive, the effect of preventing destruction of the comb electrode patterns, which is caused when charges are generated in the chip substrate due to polarization, becomes larger.

The above and many other objects, features and advantages of the present invention will become manifest to those skilled in the art upon making reference to the following detailed description and accompanying drawings in which preferred embodiments incorporating the principle of the present invention are shown by way of illustrative examples.

BRIEF DESCRIPTION OF THE DRAWINGS

FIGS. 6A to 6C are views showing an example of a package suitable for accommodating a SAW filter, in which FIG. 6A is a plan view, FIG. 6B is a sectional view taken along the line VIB—VIB of FIG. 6A, and FIG. 6C is a sectional view taken along the line VIC—VIC of FIG. 6A; and FIGS. 7 and 8 are views showing a state wherein the SAW filter is accommodated in the package, in which FIG. 7 is a plan view and FIG. 8 is a sectional view taken along the line VIIB—VIIB of FIG. 7.

DETAILED DESCRIPTION OF THE PREFERRED EMBODIMENTS

Several preferred embodiments of the present invention will be described hereinafter with reference to the accompanying drawings.

First Embodiment

Figure 1A:
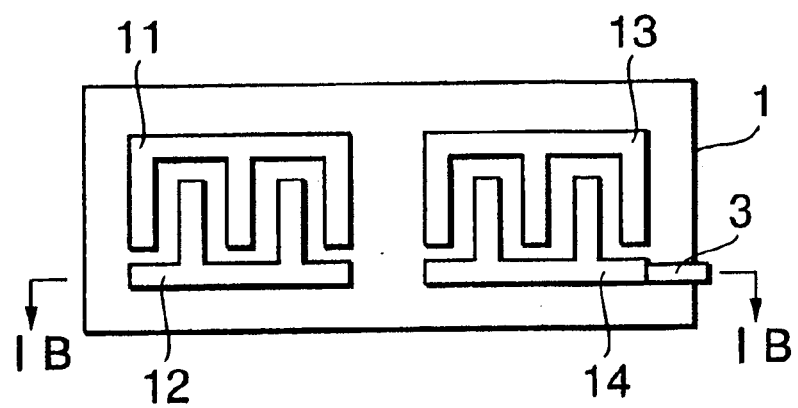
FIGS. 1A and 1B are plan and sectional views, respectively, showing a surface acoustic wave filter according to the first embodiment of the present invention.
Figure 1B:
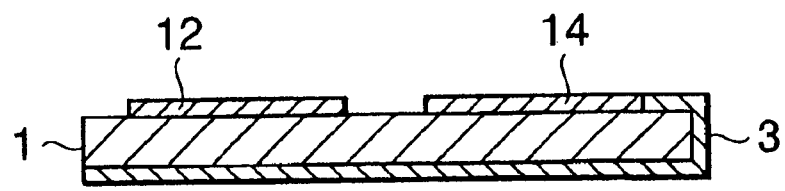

FIG. 1A is a plan view of a SAW filter according to the first embodiment of the present invention, and FIG. 1B is a sectional view taken along the line IB—IB of FIG. 1A. In the SAW filter of the first embodiment, comb electrode patterns 11, 12, 13, and 14 are formed of Al (aluminum) thin films, Al alloy thin films, or the like on a chip substrate 1 made of a piezoelectric material such as lithium tantalate ($LiTaO_3$) or lithium niobate ($LiNbO_3$).

The comb electrode patterns 11, 12, 13, and 14 are connected through bonding wires (not shown) to an input signal electrode terminal, output signal electrode terminal, and ground electrode terminals formed on a package which accommodates the SAW filter. In the SAW filter shown in FIGS. 1A and 1B, for example, the comb electrode pattern 13 serves as an input signal electrode and is connected to the input signal electrode terminal, and the comb electrode pattern 12 serves as an output signal electrode and is connected to the output signal electrode terminal. The comb electrode patterns 11 and 14 serve as ground electrodes and are connected to the ground electrode terminal.

In the SAW filter according to the first embodiment, a coating film made of a conductive material 3 such as Al covers the entire area of the lower surface of the chip substrate 1, and the comb electrode patterns serving as the ground electrodes and the metal film on the lower surface of the chip substrate 1 are connected to each other through the conductive material 3. FIG. 1B shows a case wherein the comb electrode pattern 14 and the metal film are connected to each other through the conductive material 3.

When the coating film made of the conductive material 3 is formed on the lower surface of the chip substrate 1 and the comb electrode pattern 14 and the conductive coating film are connected to each other through the conductive material 3, charges generated by polarization based on the pyroelectric effect can be expected to neutralize, and the charges generated by polarization can be released to the conductive coating film through the comb electrode pattern. Hence, undesirable charge concentration at specific portions of the comb electrode patterns 11, 12, 13, and 14 can be avoided more effectively. Accordingly, discharge between the comb electrode patterns 11, 12, 13, and 14 is prevented more effectively.

Even when the SAW filter with the structure shown in FIGS. 1A and 1B is accommodated in a plastic package, destruction of the comb electrode patterns 11, 12, 13, and 14 caused by the pyroelectric effect of the chip substrate 1 can be prevented without taking any countermeasure on the package side. More specifically, the structure shown in FIGS. 1A and 1B is particularly effective when a plastic package is used as the package for accommodating the SAW filter. If the SAW filter with the structure shown in FIGS. 1A and 1B is accommodated in a ceramic package, destruction of the comb electrode patterns 11, 12, 13, and 14 can be prevented without taking a countermeasure such as forming a metal film on the bottom surface of the ceramic package.

Second Embodiment

Figure 2A:
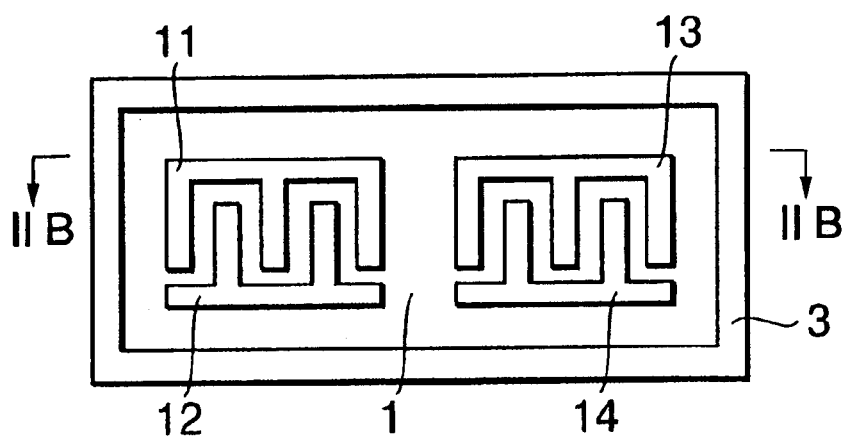
FIGS. 2A and 2B are plan and sectional views, respectively, showing a surface acoustic wave filter according to the second embodiment of the present invention.
Figure 2B:
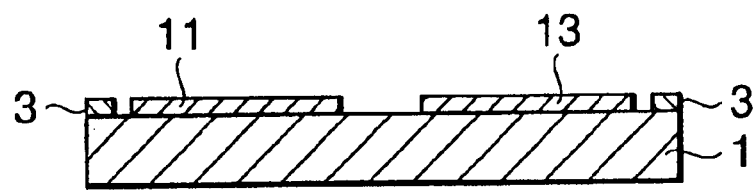

FIG. 2A is a plan view showing a SAW filter according to the second embodiment of the present invention, and FIG. 2B is a sectional view taken along the line IIB—IIB of FIG. 2A. In the SAW filter according to the second embodiment, comb electrode patterns 11, 12, 13, and 14 are formed on a chip substrate 1 made of a piezoelectric material, and the peripheral portion of the chip substrate 1 on the upper surface side is covered with a film made of a conductive material 3 such as a metal. The film made of the conductive material 3 does not cover a surface wave propagation path of the SAW filter.

When the peripheral portion of the chip substrate 1 on the upper surface side is formed with a film made of the conductive material 3, even if charges are generated by polarization, they are released to the film made of the conductive material 3, and are not concentrated at the portions of the comb electrode patterns 11, 12, 13, and 14. In other words, undesirable charge concentration at the specific portions of the comb electrode patterns 11, 12, 13, and 14 can be avoided, and discharge between the comb electrode patterns 11, 12, 13, and 14 is prevented. Since charge concentration at specific portions can be avoided, the film made of the conductive material 3 practically serves to neutralize the charges in the chip substrate 1.

Even when the SAW filter with the structure shown in FIGS. 2A and 2B is accommodated in a plastic package, destruction of the comb electrode patterns 11, 12, 13, and 14 caused by the pyroelectric effect of the chip substrate 1 can be prevented without taking any countermeasure on the package side. More specifically, the structure shown in FIGS. 2A and 2B is also particularly effective when a plastic package is used as the package for accommodating the SAW filter. If the SAW filter with the structure shown in FIGS. 2A and 2B is accommodated in a ceramic package, destruction of the comb electrode patterns 11, 12, 13, and 14 can be prevented without taking a countermeasure such as forming a metal film on the bottom surface of the ceramic package.

Third Embodiment

Figure 3A:
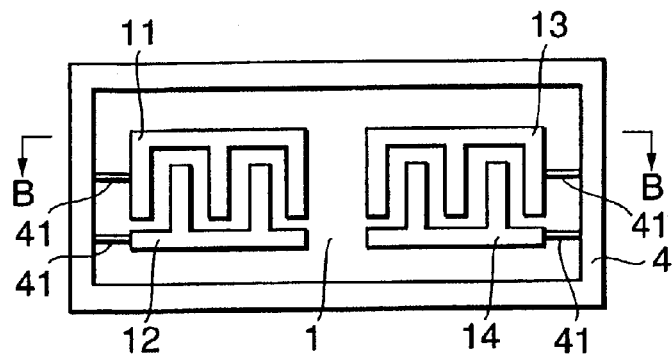
FIGS. 3A and 3B are plan and sectional views, respectively, showing a surface acoustic wave filter according to the third embodiment of the present invention.
Figure 3B:
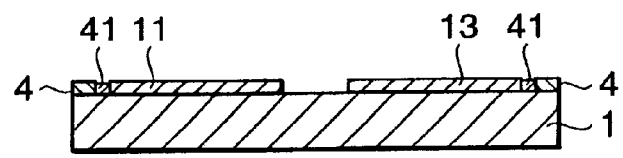

FIG. 3A is a plan view showing a SAW filter according to the third embodiment of the present invention, and FIG. 3B is a sectional view taken along the line B—B of FIG. 3A. In the SAW filter according to the third embodiment, comb electrode patterns 11, 12, 13, and 14 are formed on a chip substrate 1 made of a piezoelectric material, and are connected to each other through patterns 41 exhibiting a high resistance and made of Ti or the like.

In the example shown in FIGS. 3A and 3B, in order to connect the comb electrode patterns 11, 12, 13, and 14 to each other, a pattern 4 exhibiting a high resistance (high-resistance pattern) is formed on the peripheral portion of the chip substrate 1 on the upper surface side. As the material of the high-resistance pattern 4, a material such as Ti (titanium) or Si (silicon) with a high resistivity on the order of MΩ or more is used. Alternatively, $SiO_2$ may be used as the material of the high-resistance pattern 4. When the patterns 41 are connected to the high-resistance pattern 4, the comb electrode patterns 11, 12, 13, and 14 are connected to each other. The material of the high-resistance pattern 4 is the same as that of the patterns 41. The high-resistance pattern 4 does not cover the surface wave propagation path portion of the SAW filter. Each of the patterns 41 has such a thickness that does not adversely affect the surface acoustic wave. In particular, since the high-resistance patterns 4 and 41 connect the comb electrode patterns 11, 12, 13, and 14 to each other, they do not adversely influence the performance of the comb electrode patterns 11, 12, 13, and 14.

In the SAW filter shown in FIGS. 3A and 3B, as the comb electrode patterns 11, 12, 13, and 14 are connected to each other, they are set at the same potential. Thus, discharge between the comb electrode patterns 11, 12, 13, and 14 can be prevented. As a result, destruction of the comb electrode patterns 11, 12, 13, and 14 is prevented.

Even when the SAW filter with the structure shown in FIGS. 3A and 3B is accommodated in a plastic package, destruction of the comb electrode patterns 11, 12, 13, and 14 caused by the pyroelectric effect of the chip substrate 1 can be prevented without taking any countermeasure on the package side. More specifically, the structure shown in FIGS. 3A and 3B is also particularly effective when a plastic package is used as the package for accommodating the SAW filter. If the SAW filter with the structure shown in FIGS. 3A and 3B is accommodated in a ceramic package, destruction of the comb electrode patterns 11, 12, 13, and 14 can be prevented without taking a countermeasure such as forming a metal film on the bottom surface of the ceramic package.

Fourth Embodiment

Figure 4:
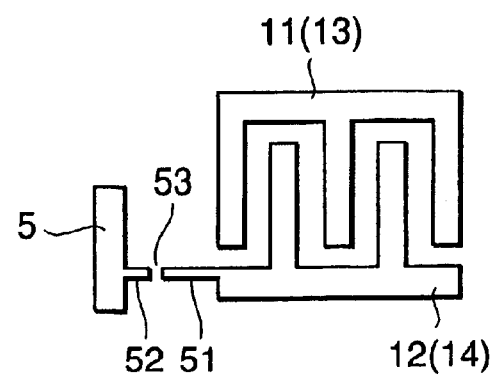
FIG. 4 is a plan view showing a surface acoustic wave filter according to the fourth embodiment of the present invention.

FIG. 4 is a plan view showing part of a SAW filter according to the fourth embodiment of the present invention. In the SAW filter according to the fourth embodiment as well, comb electrode patterns 11, 12, 13, and 14 are formed on a chip substrate 1 made of a piezoelectric material. As shown in FIG. 4, the comb electrode patterns 12 and 14 partly extend on the upper surface of the chip substrate 1, thus forming patterns 51 serving as the first pattern. Of two pairs of comb electrode patterns, FIG. 4 shows one pair.

A pattern 52 with the same line width as that of each pattern 51 and serving as the second pattern is formed to oppose the pattern 51 at a gap 53. This forms a dummy electrode pattern 5, to which the pattern 52 is connected. The width of the gap 53 (the length between the patterns 51 and 52) is smaller than that of the gap between the comb electrode pattern 11 or 13 and the comb electrode pattern 12 or 14. The line width of each of the patterns 51 and 52 is smaller than the pattern width of each of the comb electrode patterns 11, 12, 13, and 14.

In the SAW filter formed as shown in FIG. 4, since the width of the gap 53 is smaller than that of the gap between the comb electrode pattern 11 or 13 and the comb electrode pattern 12 or 14, when polarization occurs in the chip substrate 1 to generate charges, thus causing discharge, discharge occurs in the gap 53. In other words, discharge between the comb electrode patterns 11, 12, 13, and 14 can be prevented, and destruction of the comb electrode patterns 11, 12, 13, and 14 can be prevented.

Even when the SAW filter with the structure shown in FIG. 4 is accommodated in a plastic package, destruction of the comb electrode patterns 11, 12, 13, and 14 caused by the pyroelectric effect of the chip substrate 1 can be prevented without taking any countermeasure on the package side. More specifically, the structure shown in FIG. 4 is also particularly effective when a plastic package is used as the package for accommodating the SAW filter. If the SAW filter with the structure shown in FIG. 4 is accommodated in a ceramic package, destruction of the comb electrode patterns 11, 12, 13, and 14 can be prevented without taking a countermeasure such as forming a metal film on the bottom surface of the ceramic package.

When discharge occurs in the gap 53, electrical noise is produced. Charges are generated by polarization when reflow soldering or a thermal shock test is performed, and not when the SAW filter actually operates. Therefore, even if electrical noise should occur, it does not pose a problem.

Fifth Embodiment

Figure 5:
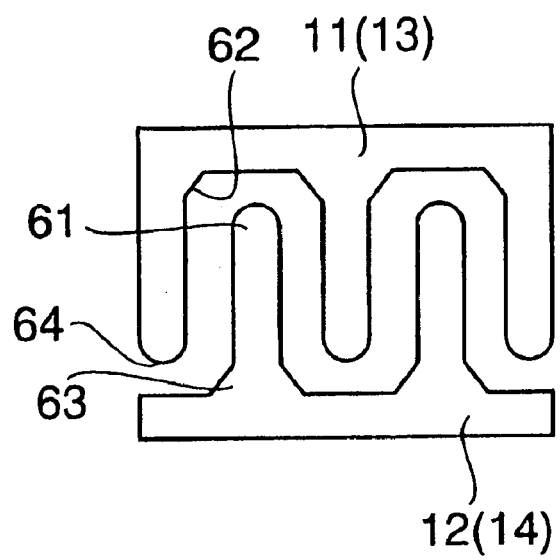
FIG. 5 is a plan view showing a surface acoustic wave filter according to the fifth embodiment of the present invention.

FIG. 5 is a plan view showing part of a SAW filter according to the fifth embodiment of the present invention. In the SAW filter according to the fifth embodiment as well, comb electrode patterns 11, 12, 13, and 14 are formed on a chip substrate 1 made of a piezoelectric material. As shown in FIG. 5, the distal ends and corners of the respective comb electrode patterns 11, 12, 13, and 14 are rounded. More specifically, of the respective comb electrode patterns 11, 12, 13, and 14, portions 61, 62, 63, and 64 each opposing a comb electrode pattern with which it makes a pair are rounded.

Since the portions 61, 62, 63, and 64 each opposing the corresponding comb electrode pattern is not sharp, even if polarization occurs in the chip substrate 1 to generate charges, discharge does not occur easily between the comb electrode patterns 11, 12, 13, and 14. In other words, discharge between the comb electrode patterns 11, 12, 13, and 14 can be prevented, and destruction of the comb electrode patterns 11, 12, 13, and 14 can be prevented.

Even when the SAW filter with the structure shown in FIG. 5 is accommodated in a plastic package, destruction of the comb electrode patterns 11, 12, 13, and 14 caused by the pyroelectric effect of the chip substrate 1 can be prevented without taking any countermeasure on the package side. More specifically, the structure shown in FIG. 5 is also particularly effective when a plastic package is used as the package for accommodating the SAW filter. If the SAW filter with the structure shown in FIG. 5 is accommodated in a ceramic package, destruction of the comb electrode patterns 11, 12, 13, and 14 can be prevented without taking a countermeasure such as forming a metal film on the bottom surface of the ceramic package.

Any one of the structures employed in the first to fifth embodiments described above can prevent destruction of the comb electrode patterns 11, 12, 13, and 14 caused by the pyroelectric effect of the chip substrate 1 without taking any countermeasure on the package side. Of the structures employed in the first to fifth embodiments, two, three, or more structures may be combined. When, a plurality of structures are combined, destruction of the comb electrode patterns 11, 12, 13, and 14 caused by the pyroelectric effect can be prevented more reliably.

In the structures employed in the first to fifth embodiments, a charge neutralizing means practically serving to neutralize or diffuse charges is realized. In the first and second embodiments, a means for rendering the potential common is realized as well as the charge neutralizing means, and in the fourth and fifth embodiments, a charge escape means is realized as well as the charge neutralizing means. In the structure employed in the third embodiment, a means for rendering the potential common is realized.

Sixth Embodiment

Figure 6A:
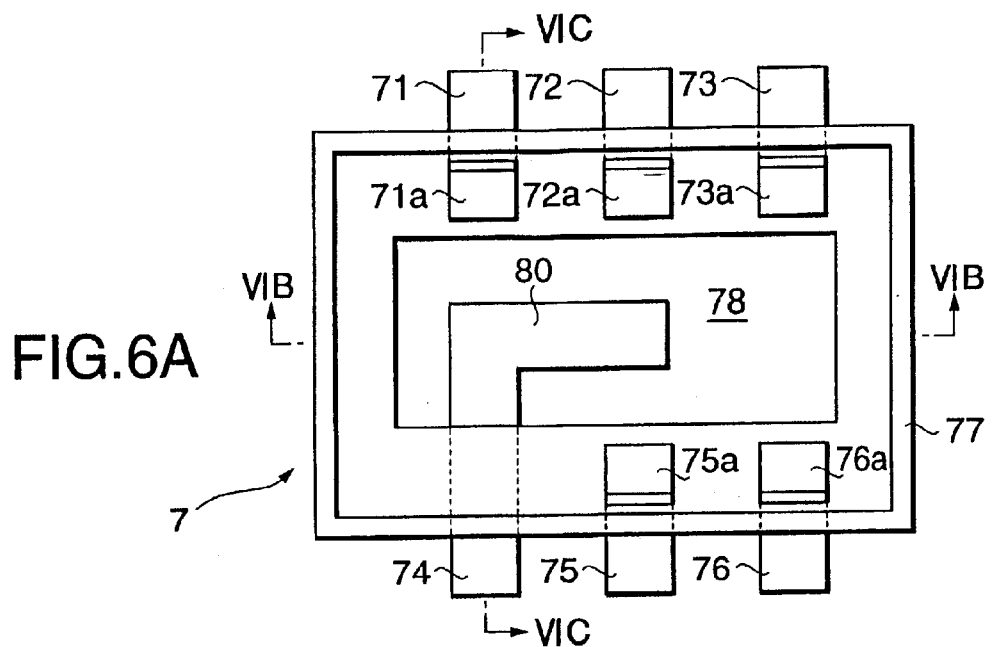
Figure 6B:
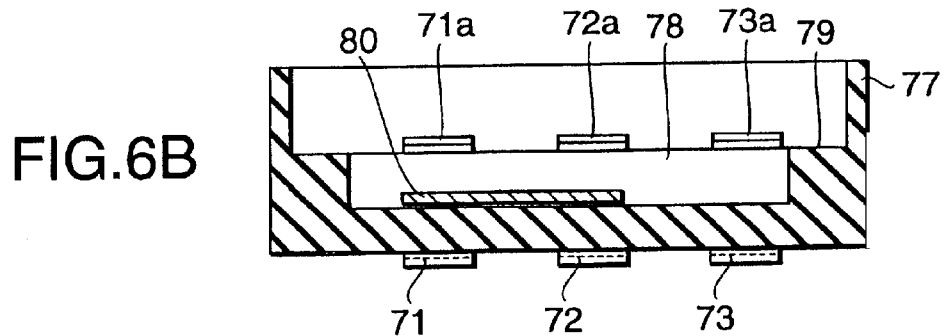
Figure 6C:
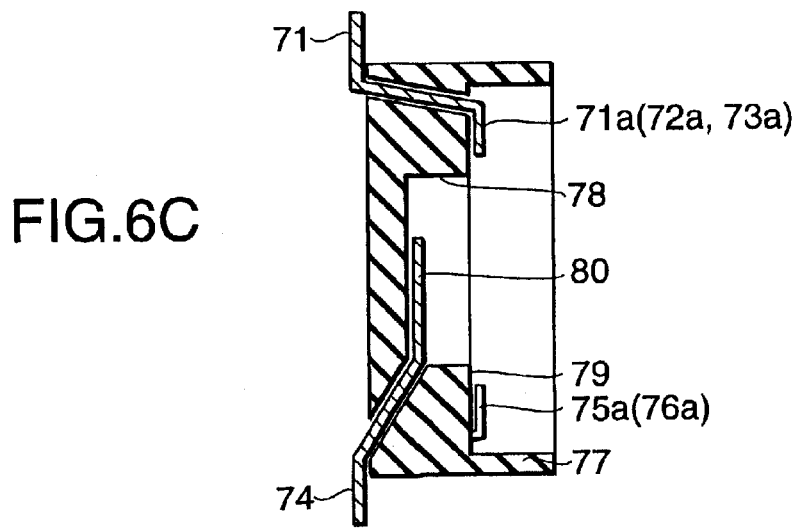

FIG. 6A is a plan view showing an arrangement of a package suitable for accommodating a SAW filter, FIG. 6B is a sectional view taken along the line VIB—VIB of FIG. 6A, and FIG. 6C is a sectional view taken along the line VIC—VIC of FIG. 6A.

In the example shown in FIGS. 6A to 6C, a package 7 has a rectangular planar shape, and a wall-like peripheral portion. A rectangular groove 78 where a SAW filter is to be set is formed at the center of the package 7.

A plurality of pads 71a, 72a, 73a, 75a, and 76a are formed on a shelf-like portion 79 between a wall-like portion (wall) 77 formed at the peripheral portion and the groove 78 at the center. Metal terminals 71, 72, 73, 74, 75, and 76 extend from the inside of the package 7 to the outside. Of the terminals 71, 72, 73, 74, 75, and 76, the terminal 74 is used as a ground terminal (GND terminal). The respective pads 71a, 72a, 73a, 75a, and 76a are integrally formed with the corresponding terminals 71, 72, 73, 75, and 76.

The GND terminal 74 extends to the inside of the package 7, and has a portion extending horizontally (horizontal extending portion) from the extending portion (vertical extending portion). The vertical and horizontal extending portions of the GND terminal 74 form a metal plate-like portion 80 exposed to the groove 78 in the package 7. Although one GND terminal 74 is formed in the example shown in FIGS. 6A to 6C, a plurality of GND terminals may be formed. For example, when two GND terminals are formed, they are integrated with the plate-like portion 80 exposed to the groove 78. In this case, since the plate-like portion 80 exposed in the groove 78 is supported at two portions, its posture is stabilized.

Figure 7:
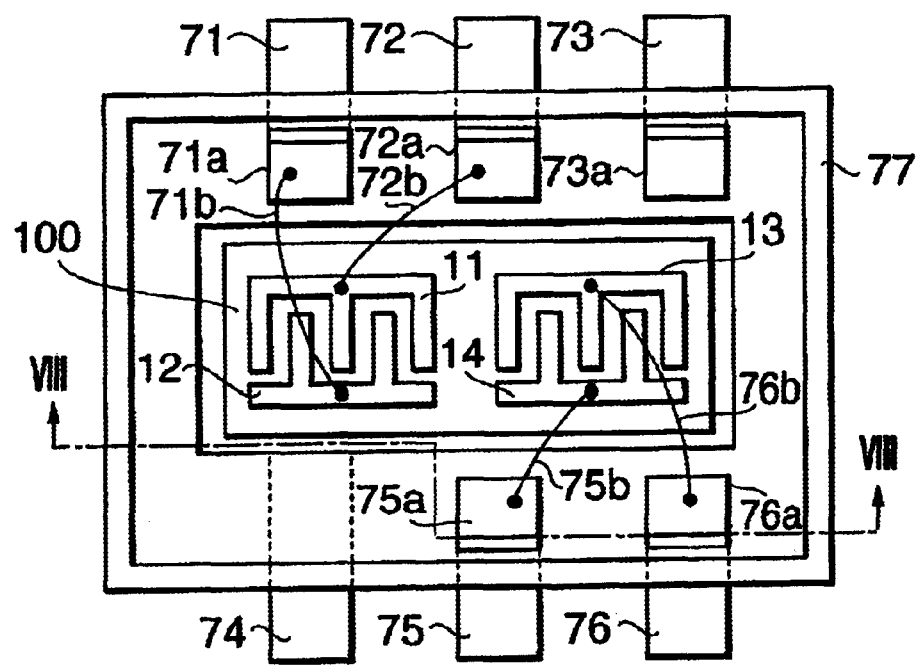
Figure 8:
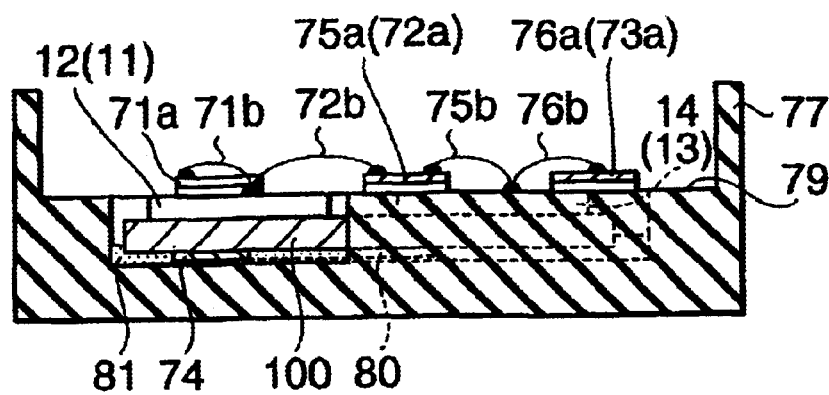

FIGS. 7 and 8 are plan and sectional views, respectively, showing a state wherein a SAW filter 100 is accommodated in the package 7 shown in FIGS. 6A to 6C. To accommodate the SAW filter 100 in the package 7, first, the SAW filter 100 is set in the groove 78 of the package 7 such that the lower surface of the chip substrate comes into contact with the plate-like portion 80. The comb electrode patterns 11, 12, 13, and 14 and the predetermined pads 71a, 72a, 75a, and 76a are connected to each other through bonding wires 71b, 72b, 75b, and 76b. After that, the upper surface of the package 7 is closed with a plastic member of the like.

The package 7 shown in FIGS. 6A to 6C has the metal plate-like portion 80. The plate-like portion 80 is integrated with the GND terminal 74. When the SAW filter 100 is accommodated in the package 7, the metal plate comes into contact with the lower surface of the chip substrate. It is thus expected that charges generated by polarization will be neutralized without concentrating at the upper surface of the chip substrate of the SAW filter 100. Thus, undesirable charge concentration at the specific portions of the comb electrode patterns 11, 12, 13, and 14 can be avoided. As a result, discharge between the comb electrode patterns 11, 12, 13, and 14 is prevented.

For example, if the GND terminal 74 is electrically connected to the outside through a portion outside the package 7 (e.g., on the printed wiring board), the GND terminal 74 and a comb electrode pattern serving as a ground electrode can be connected to each other. A state wherein the GND terminal 74 and the comb electrode pattern are connected to each other is similar to the state of the first embodiment shown in FIGS. 1A and 1B. In this state, charges generated by polarization based on the pyroelectric effect can be expected to neutralize, and can be released to the metal plate located on the lower surface of the chip substrate through the comb electrode pattern. Therefore, undesirable charge concentration at the specific portions of the comb electrode patterns 11, 12, 13, and 14 can be avoided more effectively.

In other words, if the package 7 of this embodiment is used, even if no countermeasure against the charges generated by polarization is taken on the side of the SAW filter itself, destruction of the comb electrode patterns 11, 12, 13, and 14 can be prevented. If a SAW filter that has undergone a countermeasure as shown in the above first to fifth embodiments is accommodated in the package 7 shown in FIGS. 6A to 6C, destruction of the comb electrode patterns 11, 12, 13, and 14 can be prevented more reliably. Namely, the SAW filter apparatus in which a SAW filter according to the first to fifth embodiments is accommodated in the package 7 shown in FIGS. 6A to 6C is more resistant against destruction of the comb electrode patterns 11, 12, 13, and 14.

In the package 7 shown in FIGS. 6A to 6C, the metal plate-like portion 80 is integrated with the GND terminal 74. When forming the terminals 71 to 76 on the package 7, the metal plate-like portion 80 is formed by only forming an L-shaped metal plate as the GND terminal 74. In other words, when the terminals 71 to 76 are formed, the plate-like portion 80 is formed simultaneously. Hence, the process for forming the package 7 does not become complicated. The structure shown in FIGS. 6A to 6C can thus be employed for the ceramic package. In this case, the manufacturing process can be simplified when compared to a case wherein a metal film is formed on the bottom surface in the package by plating or vapor deposition.

Seventh Embodiment

Furthermore, when the SAW filter 100 is to be accommodated in the package 7 shown in FIGS. 6A to 6C, it may be fixed to the package 7 with a conductive adhesive 81, as shown in FIG. 8. As shown in FIG. 8, the metal plate-like portion 80 is located between the SAW filter 100 and package 7. When fixing the SAW filter 100 to the package 7 with the conductive adhesive 81, connection between the SAW filter 100 and plate-like portion 80 becomes firm. Therefore, electrical connection between the SAW filter 100 and the metal plate-like portion 80 can become more reliable.

As has been described above, according to the first to fifth embodiments, the structure of the chip substrate 1 itself of the SAW filter can neutralize or release charges generated by polarization. When this SAW filter is accommodated in a plastic package, even if a sharp temperature change occurs in the surrounding environment, destruction of the comb electrode patterns 11, 12, 13, and 14 can be prevented. In other words, in a SAW filter apparatus in which a SAW filter with a structure according to the first to fifth embodiments is accommodated in a plastic package, even if a sharp temperature change occurs in the surrounding environment, destruction of the comb electrode patterns 11, 12, 13, and 14 can be prevented. Also, the chip substrate 1 with the structure shown in the first to fifth embodiments can be accommodated in a ceramic package.

According to the sixth and seventh embodiments, in the package 7, a metal plate with which the lower surface of the chip substrate comes into contact when a SAW filter is to be accommodated can be formed without using plating or vapor deposition. When the package 7 shown in the sixth and seventh embodiments is used, even if no countermeasure against charges generated by polarization is taken on the side of the SAW filter itself, destruction of the comb electrode patterns 11, 12, 13, and 14 can be prevented. In other words, even with a SAW filter that has not undergone countermeasures shown in the first to fifth embodiments, when it is accommodated in the package 7, even if a sharp temperature change occurs in the surrounding environment, destruction of the comb electrode patterns 11, 12, 13, and 14 can be prevented.

What is claimed is:

1. A surface acoustic wave filter in which a plurality of pairs of comb electrode patterns are formed on an upper surface of a chip substrate made of a piezoelectric material, comprising a high-resistance pattern formed to surround a peripheral portion of the chip substrate on an upper surface side thereof, and a plurality of patterns formed to connect the high-resistance pattern to the respective comb electrode patterns.

2. A surface acoustic wave filter apparatus in which the surface acoustic wave filter according to claim 1 is accommodated in a package.

3. An apparatus according to claim 2, wherein the package is a plastic package.

4. An apparatus according to claim 3, wherein a metal plate-like portion is formed at a center of the package.

5. An apparatus according to claim 4, wherein a lower surface of the chip substrate which constitutes the surface acoustic wave filter is fixed to the package with a conductive adhesive.

6. A surface acoustic wave filter in which a plurality of pairs of comb electrode patterns are formed on an upper surface of a chip substrate made of a piezoelectric material, comprising a first pattern formed on the upper surface of the chip substrate so as to extend from part of at least one member of each of the pairs of comb electrode patterns, a second pattern formed on the upper surface of the chip substrate so as to oppose the first pattern at a predetermined gap, and a dummy electrode pattern formed on the upper surface of the chip substrate so as to be adjacent to the second pattern and connected thereto.

7. A surface acoustic wave filter apparatus in which the surface acoustic wave filter according to claim 6 is accommodated in a package.

8. An apparatus according to claim 7, wherein the package is a plastic package.

9. An apparatus according to claim 8, wherein a metal plate-like portion is formed at a center of the package.

10. An apparatus according to claim 9, wherein a lower surface of the chip substrate which constitutes the surface acoustic wave filter is fixed to the package with a conductive adhesive.

11. A surface acoustic wave filter, comprising:

a plurality of pairs of comb electrode patterns formed on an upper surface of a chip substrate made of a piezoelectric material, wherein opposing portions of two comb electrode patterns that form a pair are not sharp, and wherein the filter is accommodated in a plastic package.

12. An apparatus according to claim 11, wherein a metal plate-like portion is formed at a center of the package.

13. An apparatus according to claim 12, wherein a lower surface of the chip substrate which constitutes the surface acoustic wave filter is fixed to the package with a conductive adhesive.

14. The surface acoustic wave filter of claim 11, wherein the comb electrode patterns that are formed on a chip substrate further comprise a high-resistance pattern that is formed to surround a peripheral portion of the chip substrate on an upper surface of the substrate.

15. The surface acoustic wave filter according to claim 14 wherein the comb electrode patterns are set at the same potential to each other and connected to the high-resistance pattern.

16. The surface acoustic wave filter according to claim 11 further comprising:

a dummy electrode pattern formed on the upper surface of the chip substrate so as to be adjacent to the comb electrode patterns.

17. A surface acoustic wave filter, comprising:

a plurality of comb electrode patterns formed on a first surface of a chip substrate, wherein the comb electrode patterns nerve as an input signal electrode terminal, an output signal electrode terminal, and a ground electrode terminal; and a coating film of a conductive material, wherein the coating film covers at least part of a second surface of the chip substrate and wherein the coating film is connected to the ground electrode terminal on the first surface of the chip substrate, and wherein the coating film is connected to the ground electrode terminal by an extension of the coating film conductive material from the coating film on the second surface to the ground electrode terminal on the first surface.

18. The surface acoustic wave filter of claim 17, wherein the input signal electrode terminal, the output signal electrode terminal, and the ground electrode terminal are formed on a package which accommodates the filter and are each connected to the comb electrode patterns through a conductive material.

19. A surface acoustic wave filter, comprising:

a plurality of pairs of comb electrode patterns formed on an upper surface of a chip substrate made of a piezoelectric material, comprising a first pattern formed on the upper surface of the chip substrate so as to extend from part of at least one member of each of the pain of comb electrode patterns, and a second pattern formed on the upper surface of the chip substrate so as to oppose the first pattern at a predetermined gap, wherein said second pattern includes a first line extension pattern having a line width narrower than the width of said second pattern; and a dummy electrode pattern formed on the upper surface of the chip substrate that includes a second line extension pattern opposing said first line extension pattern, said second line extension patter having a line width narrower than the width of said second pattern, wherein a width of a gap between said first and said second line extension patterns is narrower than said predetermined gap between said first and said second patterns.

* * * * *